United States Patent
Chen et al.

(10) Patent No.: US 8,571,158 B2
(45) Date of Patent: Oct. 29, 2013

(54) METHOD AND DATA TRANSCEIVING SYSTEM FOR GENERATING REFERENCE CLOCK SIGNAL

(75) Inventors: An-Chung Chen, Hsinchu (TW);
Wen-Lung Cheng, Taipei (TW);
Wei-Yung Chen, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 408 days.

(21) Appl. No.: 12/857,754

(22) Filed: Aug. 17, 2010

(65) Prior Publication Data

US 2011/0311012 A1    Dec. 22, 2011

(30) Foreign Application Priority Data

Jun. 22, 2010   (TW) ................................ 99120274 A (51) Int. Cl.
*H04L 7/00*   (2006.01)
(52) U.S. Cl.
USPC .......................................... 375/354; 375/373
(58) Field of Classification Search
USPC .......... 375/371, 376, 375, 373, 354; 331/1 A;
714/707; 713/502, 500; 327/156, 141
See application file for complete search history.

(56) References Cited

U.S. PATENT DOCUMENTS

| | | | |
|---|---|---|---|
| 5,793,437 A | 8/1998 | Inamori | |
| 2004/0109521 A1* | 6/2004 | Jeong et al. | 375/376 |
| 2005/0081076 A1* | 4/2005 | Okuda | 713/600 |
| 2006/0021491 A1* | 2/2006 | Greco et al. | 84/293 |
| 2007/0174727 A1* | 7/2007 | Liao et al. | 714/43 |
| 2009/0228746 A1* | 9/2009 | Yang | 714/707 |
| 2010/0179673 A1* | 7/2010 | Muroi | 700/94 |
| 2011/0093736 A1* | 4/2011 | Chiang et al. | 713/502 |
| 2012/0051479 A1* | 3/2012 | Liu et al. | 375/371 |

FOREIGN PATENT DOCUMENTS

| | | |
|---|---|---|
| CN | 1378739 | 11/2002 |
| CN | 1647161 | 7/2005 |
| CN | 1940808 | 4/2007 |
| CN | 1955949 | 5/2007 |
| CN | 101179371 | 5/2008 |
| CN | 101599755 | 12/2009 |

OTHER PUBLICATIONS

"First Office Action of China counterpart application" issued on Sep. 18, 2012, p.1-p.7, in which the listed references were cited.
"Second Office Action of China counterpart application" issued on Apr. 12, 2013, p.1-p.8, in which the listed references were cited.

* cited by examiner

*Primary Examiner* — Aristocratis Fotakis
(74) *Attorney, Agent, or Firm* — J.C. Patents (57) ABSTRACT

A method and a data transceiving system for generating a reference clock signal are provided. The data transceiving system comprises a voltage controlled oscillator, a phase lock loop (PLL) unit, and a data receiver. The voltage controlled oscillator is used to generate a reference clock signal. The PLL unit is used to increase a clock frequency of the reference clock signal to generate a PLL clock signal. The data receiver is used to compare the PLL clock signal with a clock signal of an input data stream, so as to output a voltage adjusting signal to the voltage controlled oscillator. The voltage controlled oscillator adjusts the clock frequency of the reference clock signal to be generated according to the reference clock signal, so as to lock the clock frequency of the PLL clock signal to a base frequency of the clock signal of the input data stream.

16 Claims, 9 Drawing Sheets

METHOD AND DATA TRANSCEIVING SYSTEM FOR GENERATING REFERENCE CLOCK SIGNAL

CROSS-REFERENCE TO RELATED APPLICATION

This application claims the priority benefit of Taiwan application serial no. 99120274, filed on Jun. 22, 2010. The entirety of the above-mentioned patent application is hereby incorporated by reference herein and made a part of specification.

BACKGROUND OF THE INVENTION

1. Field of the Invention

The present invention is related to a data transceiving system, and more particularly, to a method and a data transceiving system for generating a reference clock signal.

2. Description of Related Art

Figure 1:
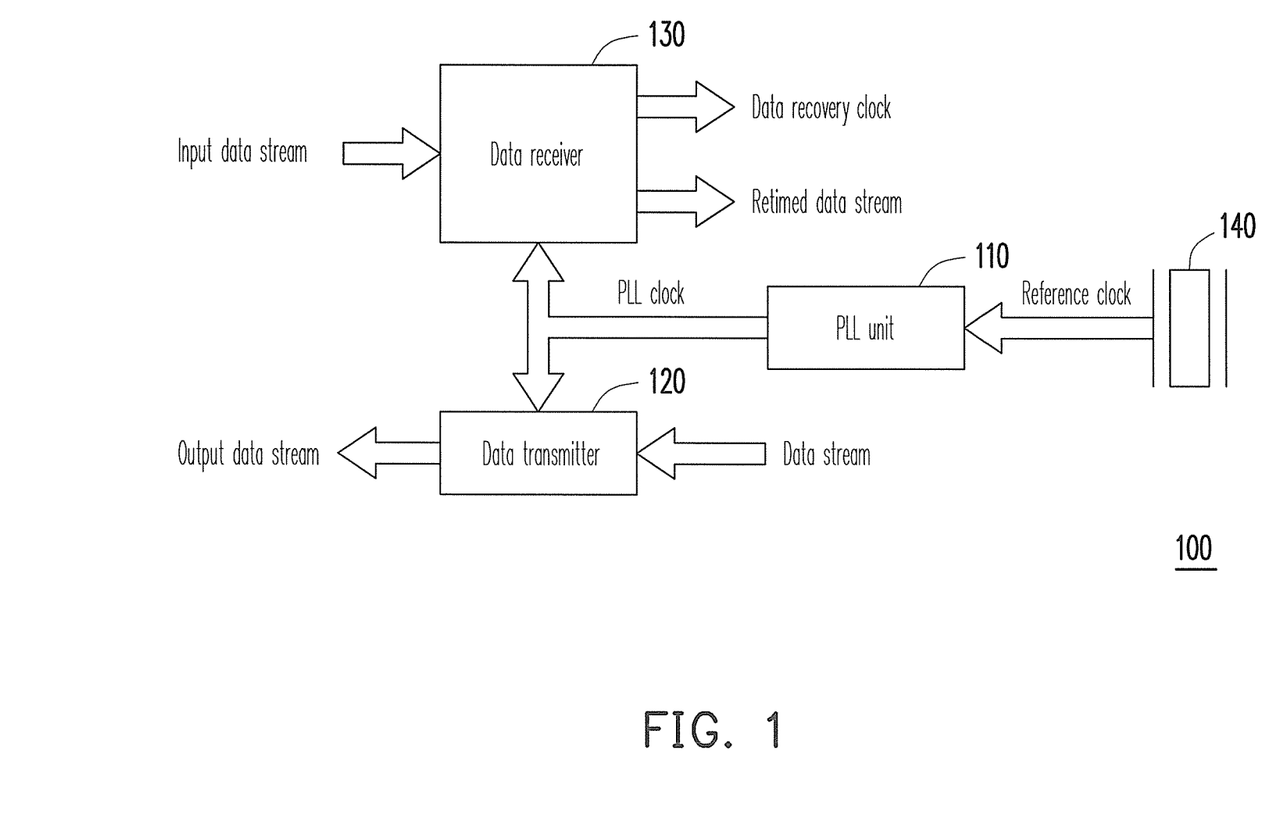
FIG. 1 illustrates a structure of a data transceiver of a conventional integrated chip.

FIG. 1 illustrates a structure of a data transceiver of a conventional integrated chip. The data transceiver 100 comprises a phase lock loop (PLL) unit 110, a data transmitter (TX) 120, and a data receiver (RX) 130 having a function of clock data recovery (CDR). The integrated chip generates a clock signal having an accurate frequency (i.e. less than tens ppm deviating from a target frequency) by using a crystal device 140, and uses the same as a reference clock for transceiving data. In detail, the PLL unit 110 uses the reference clock as an input to generate a PLL clock output which has a frequency equal to a multiple of the clock frequency of the reference clock. The PLL clock is used as a reference clock for clock data recovery and used for generating a retimed data stream. The clock output generated during the clock data recovery is generated based on a base frequency of the received input data stream. Further, the PLL clock may also be used as a clock signal source and used for transmitting a data stream that is originally not accompanied by a clock signal.

The accuracy of the reference frequency of the PLL clock is essential in serial data transmission and can only tolerate considerably small frequency error. In detail, the frequency error is required to comply with a given standard specification, which is usually the allowable maximum of the bit error rate (BER). For example, in the high-speed (HS) mode of universal serial bus (USB) 2.0 specification, the accuracy of the PLL clock frequency is about 500 ppm deviating from a base frequency of the received data stream. Although a commercial crystal device may provide a clock signal with the frequency error less than 100 ppm and can serve as an ideal clock signal source, this kind of crystal device usually costs a lot and occupies a larger space of the circuit board.

SUMMARY OF THE INVENTION

The present invention provides a method and data transceiving system for generating a reference clock signal with accurate frequency for transceiving data.

The present invention provides a data transceiving system for generating reference clock signal, which comprises a voltage controlled oscillator, a PLL unit and a data receiver. The voltage controlled oscillator is used for generating a reference clock signal. The PLL unit is coupled to the voltage controlled oscillator and used for increasing a clock frequency of the reference clock signal to generate a PLL clock signal. The data receiver is coupled to the PLL unit and the voltage controlled oscillator, and used for comparing the PLL clock signal with the clock signal of an input data stream and accordingly outputting a voltage adjusting signal to the voltage controlled oscillator. The voltage controlled oscillator adjusts the clock frequency of the reference clock signal according to the voltage adjusting signal, so as to lock the clock frequency of the PLL clock signal generated by the PLL unit to a base frequency of the clock signal of the input data stream.

In one embodiment of the present invention, the data receiver comprises a frequency detector and a frequency lock controller. The frequency detector is used for comparing the clock frequency of the PLL clock signal with the base frequency of the clock signal of the input data stream and accordingly generates the frequency adjusting signal. The frequency lock controller is used for receiving the frequency adjusting signal and the PLL clock signal, and accordingly generates the voltage adjusting signal.

In one embodiment of the present invention, the frequency detector outputs a logic high signal when the base frequency of the clock signal of the input data stream is larger than the clock frequency of the PLL clock signal, and outputs a logic low signal when the base frequency of the clock signal of the input data stream is smaller than the clock frequency of the PLL clock signal.

In one embodiment of the present invention, the frequency lock controller increases a value of the voltage adjusting signal when receiving the logic high signal, so as to control the voltage controlled oscillator to increase the clock frequency of the reference clock signal; and reducing the value of the voltage adjusting signal when receiving the logic low signal, so as to control the voltage controlled oscillator to reduce the clock frequency of the reference clock signal.

In one embodiment of the present invention, the data receiver comprises a clock and data recovery circuit, a start-of-frame (SOF) decoder and a frequency lock controller. The clock and data recovery circuit is used for receiving the input data stream and the PLL clock signal, and transforming the received input data stream into a retimed data stream by using the PLL clock signal as a reference clock. The SOF decoder is used for finding a SOF of each of a plurality of frames in the retimed data stream, so as to generate a SOF signal. The frequency lock controller is used for receiving the SOF signals generated by the SOF decoder and the PLL clock signal, counting the SOF signals by using the PLL clock signal, and accordingly generating the voltage adjusting signal.

In one embodiment of the present invention, the frequency lock controller compares a count of the SOF signals with a standard value, increases a value of the voltage adjusting signal when the count is smaller than the standard value, so as to control the voltage controlled oscillator to increase the clock frequency of the reference clock signal, and reduces the value of the voltage adjusting signal when the count is larger than the standard value, so as to control the voltage controlled oscillator to reduce the clock frequency of the reference clock signal.

In one embodiment of the present invention, the voltage controlled oscillator increases or reduces the clock frequency of the generated reference clock signal by a frequency level according to the voltage adjusting signal. The frequency level is a product of a frequency gain and a voltage variation of the voltage controlled oscillator.

In one embodiment of the present invention, the data transceiving system further comprises a digital-to-analog converter, which is disposed between the voltage controlled oscillator and the data receiver and used for transforming the voltage adjusting signal outputted by the data receiver into the voltage variation, so as to adjust the clock frequency of the reference clock signal generated by the voltage controlled oscillator.

In one embodiment of the present invention, the data transceiving system further comprises a data transmitter, which is coupled to the PLL unit and is used for receiving a output data stream and the PLL clock signal and transmitting the output data stream according to the PLL clock signal.

The present invention provides a method for generating a reference clock signal, in which a reference clock signal is generated by using a voltage controlled oscillator, and a clock frequency of the reference clock signal is increased to generate a PLL clock signal. Then, the PLL clock signal and a clock signal of the input data stream is compared, so as to output a voltage adjusting signal. Finally, the clock frequency of the reference clock signal generated by the voltage controlled oscillator is adjusted according to the voltage adjusting signal, so as to lock the clock frequency of the generated PLL clock signal to the base frequency of the clock signal of the input data stream.

Based on the above, the method and the data transceiving system for generating a reference clock signal of the present invention dispose a voltage controlled oscillator in the integrated chip to generate a reference clock signal and use the clock signal of the received input data stream to correct the frequency of the reference clock signal. The correction is feedback to the voltage controlled oscillator to adjust the clock frequency of the reference clock signal generated by the voltage controlled oscillator, such that the clock frequency of the PLL clock signal generated by the PLL unit can be locked to the clock frequency of the clock signal of the input data stream. Accordingly, the present invention is able to generate a PLL clock signal with accurate frequency without using a crystal device.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention uses a voltage controlled oscillator disposed inside an integrated chip to replace a conventional crystal device and to generate a reference clock signal for transmitting a data stream. Since a variation on process-voltage-temperature (PVT) may increase the frequency error of the signal generated by the oscillator, the conventional oscillator cannot be used in the serial data transceiver. To compensate the effect acted on the oscillator resulting from such factors so as to apply the oscillator in the integrated chip, the present inventions adopts a feedback system, in which the base frequency of the received data stream is compared with the clock frequency of a PLL clock signal, so as to generate a frequency adjusting signal for adjusting the clock frequency of the reference clock signal generated by the oscillator and further obtaining a PLL clock signal with a more accurate frequency. Embodiments are provided below for illustrating operations of the data transceiving system for generating the reference clock signal of the present invention.

First Embodiment

Figure 2:
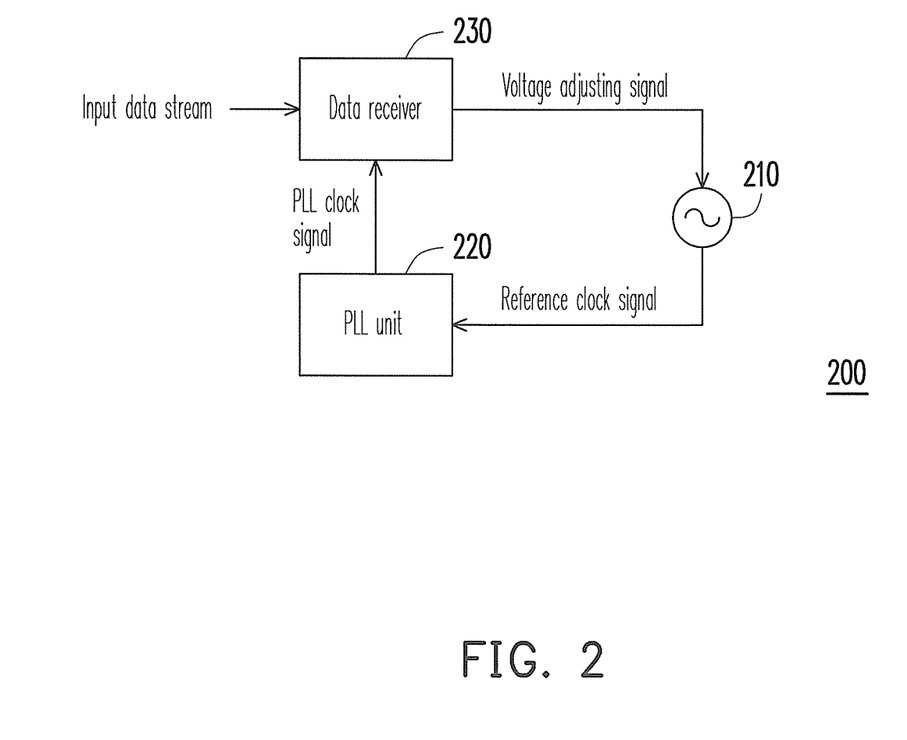
FIG. 2 is a block diagram of a data transceiving system for generating a reference clock signal according to first embodiment of the present invention.

FIG. 2 is a block diagram of a data transceiving system for generating a reference clock signal according to first embodiment of the present invention. Referring to FIG. 2, the data transceiving system 200 of the present embodiment comprises a voltage controlled oscillator 210, a PLL unit 220 and a data receiver 230, and the functions thereof are respectively described in the following.

The voltage controlled oscillator 210 is, for example, a resistance/capacitance (RC) oscillator, a ring oscillator, or an inductance/capacitance (LC) oscillator for generating a reference clock signal.

The PLL unit 220 is coupled to the voltage controlled oscillator 210 and is used for outputting a PLL clock signal having a predetermined frequency and phase by using the reference clock signal outputted by the voltage controlled oscillator 210.

Figure 3:
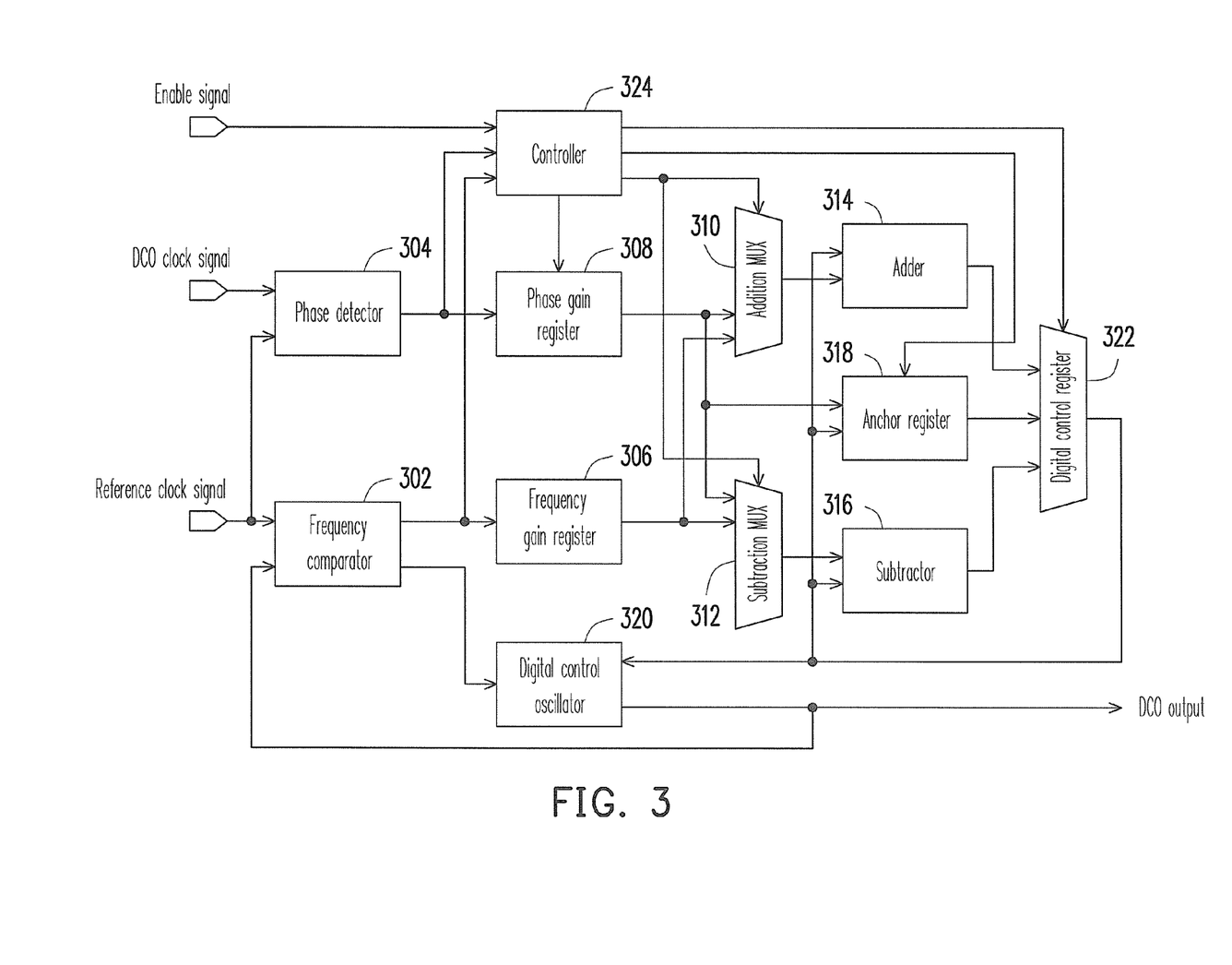
FIG. 3 is an example of a PLL unit according to first embodiment of the present invention.

In the present embodiment, the PLL unit 220 is implemented in a digital means. For example, FIG. 3 is an example of a PLL unit according to first embodiment of the present invention. Referring to FIG. 3, the PLL unit 300 may comprise a frequency comparator 302, a phase detector 304, a frequency gain register 306, a phase gain register 308, an addition MUX 310, a subtraction MUX 312, an adder 314, a subtractor 316, an anchor register 318, a digital control oscillator (DCO) 320, a digital control register 322 and a controller 324.

Figure 4:
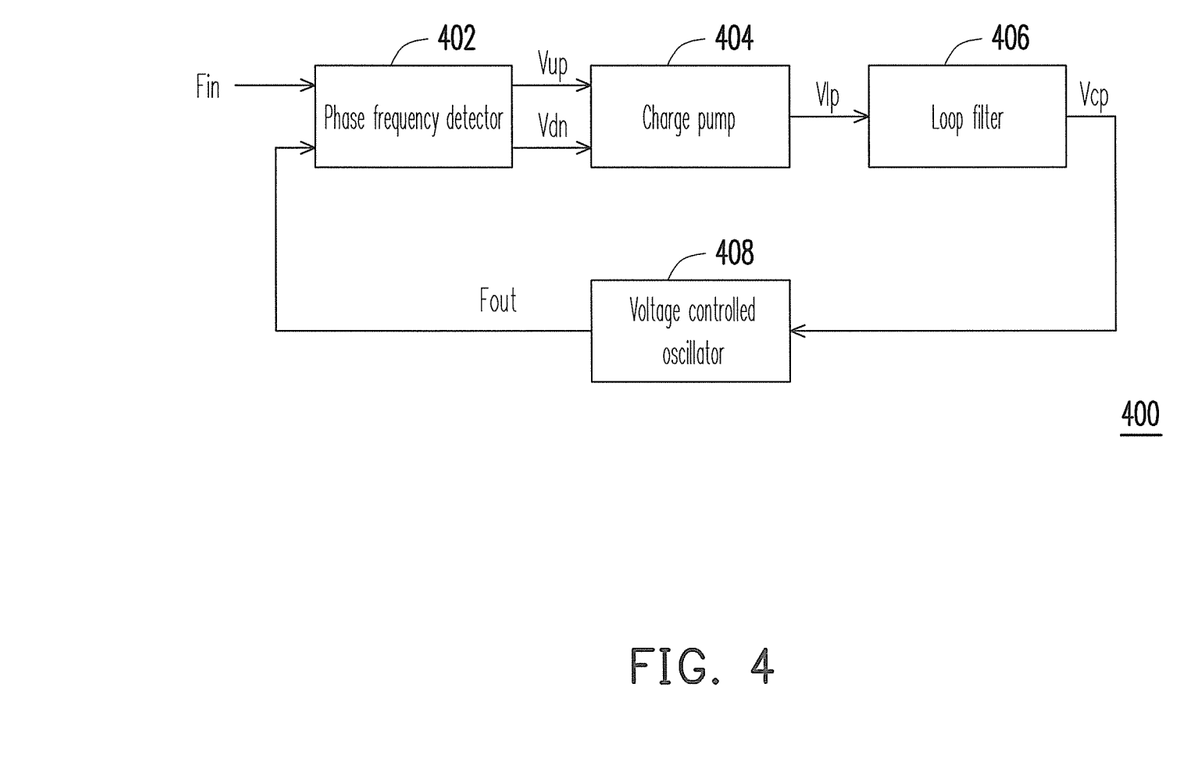
FIG. 4 is an example of a PLL unit according to first embodiment of the present invention.

In another exemplary embodiment, the PLL unit 220 may also be implemented in an analog means or in a combination of the digital and analog means. For example, FIG. 4 is an example of a PLL unit according to first embodiment of the present invention. Referring to FIG. 4, the PLL unit 400 comprises a phase frequency detector (PFD) 402, a charge pump (CP) 404, a loop filter (LP) 406, and a voltage controlled oscillator (VCO) 408. In this text, since the PLL is a technique familiar to persons skilled in the art, the detail is omitted herein.

The data receiver 230 is coupled to the PLL unit 220 and the voltage controlled oscillator 210, and used for receiving input data stream sent externally and the PLL clock signal outputted by the PLL unit 220, and comparing the PLL clock signal with a clock signal of the input data stream so as to output a voltage adjusting signal to the voltage controlled oscillator 210 to control the voltage controlled oscillator 210 to adjust the clock frequency of the reference clock signal.

In detail, the voltage controlled oscillator 210, for example, adjusts the clock frequency of the reference clock signal according to the voltage adjusting signal. Through repeatedly executing aforesaid steps of the PLL unit 220 generating the PLL clock signal, the data receiver 130 comparing the clock signal, and the voltage controlled oscillator 210 adjusting the clock frequency, finally the clock frequency of the PLL clock signal generated by the PLL unit 220 can be locked to the base frequency of the clock signal of the input data stream.

It is noted herein that, regarding the comparison between the PLL clock signal and input data stream, the present invention provides two exemplary methods. One method is to directly compare the clock frequency of the PLL clock signal with the base frequency of the clock signal of the input data stream, so as to determine whether to increase or reduce the clock frequency of the reference clock signal generated by the voltage controlled oscillator. The other method is to count the start-of-frames (SOFs) of a plurality of frames in the data stream in a unit time, so as to determine whether to increase or reduce the clock frequency of the reference clock signal generated by the voltage controlled oscillator. Embodiments according to aforesaid two methods are given below for further illustration.

Second Embodiment

Figure 5:
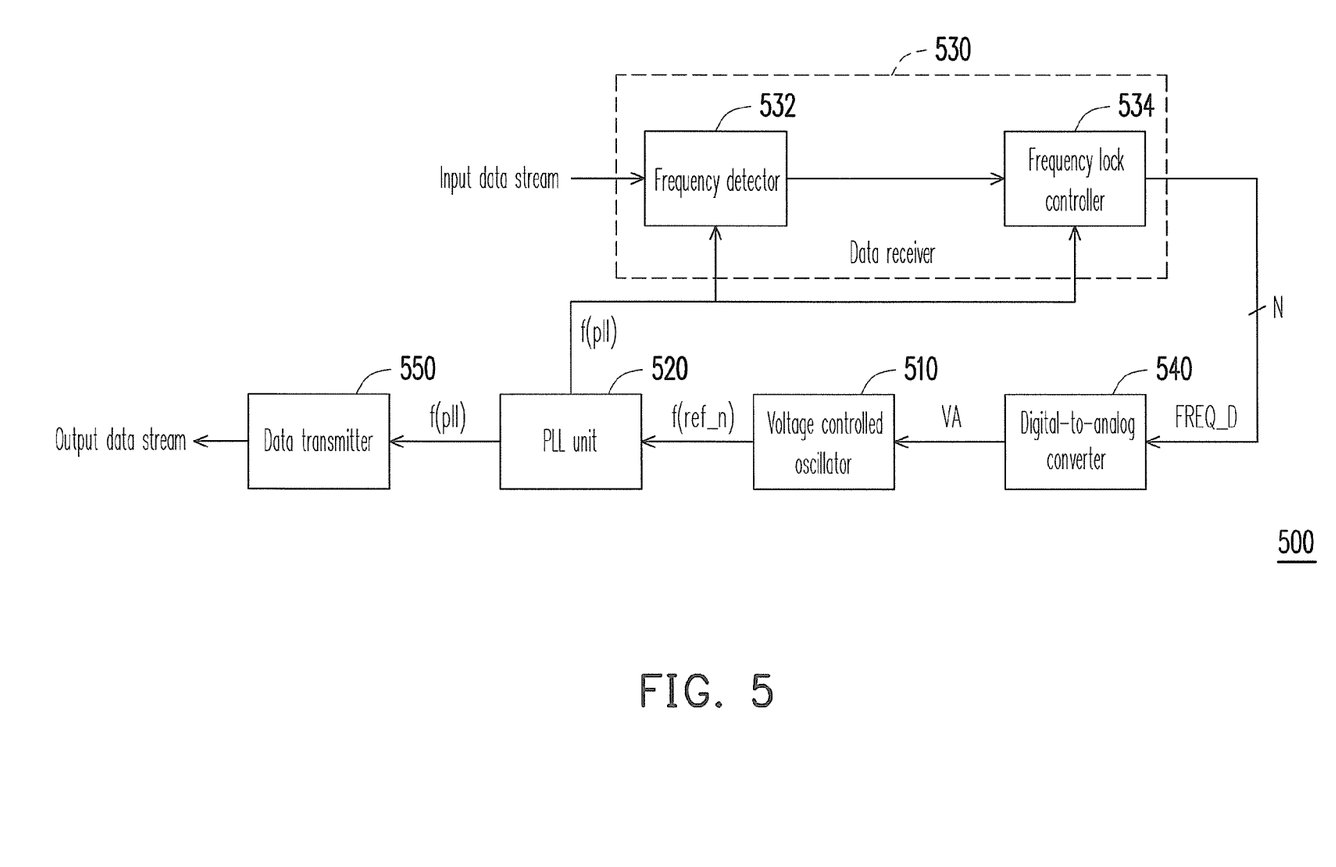
FIG. 5 is a block diagram of a data transceiving system for generating a reference clock signal according to second embodiment of the present invention.
Figure 6:
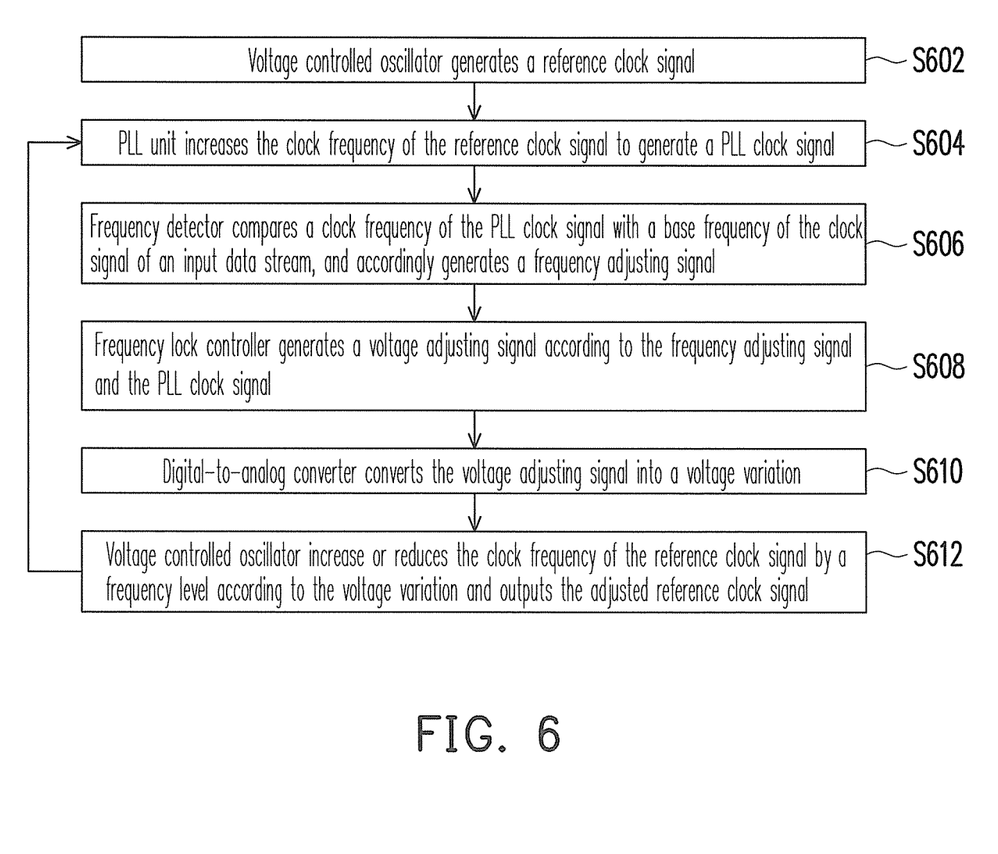
FIG. 6 is flowchart illustrating a method for generating a reference clock signal according to second embodiment of the present invention.

FIG. 5 is a block diagram of a data transceiving system for generating a reference clock signal according to second embodiment of the present invention. FIG. 6 is flowchart illustrating a method for generating a reference clock signal according to second embodiment of the present invention. Referring to both FIG. 5 and FIG. 6, the data transceiving system 500 of the present embodiment comprises a voltage controlled oscillator 510, a PLL unit 520, a data receiver 530, a digital-to-analog converter 540, and a data transmitter 550, in which the data receiver 530 further comprises a frequency detector 532 and a frequency lock controller 534. Detailed steps of the method for generating the reference clock signal of the present invention are described with the elements described in the above.

First, the voltage controlled oscillator 510 generates a reference clock signal (step S602). The voltage controlled oscillator 210 is, for example, a resistance/capacitance (RC) oscillator, a ring oscillator, or an inductance/capacitance (LC) oscillator for generating the reference clock signal. Currently, the reference clock signal generated by the voltage controlled oscillator 510 is, for example, a predetermined value and will be corrected gradually by rear circuits.

Next, the PLL unit 520 increases the clock frequency (ref_n) of the reference clock signal outputted by the voltage controlled oscillator 510, so as to generate the PLL clock (pll) (step S604), wherein f(pll)=M*f(ref_n) and M is a value larger than 1.

Then, the frequency detector 532 of the data receiver 530 receives the input data stream sent externally and the PLL clock signal sent by the PLL unit 520, and compares the clock frequency of the PLL clock signal with the base frequency of the clock signal of the input data stream, so as to generate the frequency adjusting signal (step S606). In detail, the frequency detector 532 of the data receiver 530 compares the clock frequency of the PLL clock signal with the clock signal of the input data stream and accordingly generates the frequency adjusting signal, so as to make the clock frequency of the PLL clock signal close to the clock signal of the input data stream. The frequency detector 532 is, for example, a rotational frequency detector, a wide range frequency detector, a differential frequency detector, or a digital quadricorrelator frequency detector.

Further, in one embodiment, the frequency detector, for example, outputs a logic high signal to increase the frequency when the clock frequency of the PLL clock signal is smaller than the base frequency of the clock signal of the input data stream, and outputs a logic low signal to reduce the frequency when the clock frequency of the PLL clock signal is larger than the base frequency of the clock signal of the input data stream. Moreover, in another embodiment, the frequency detector 532, for example, adjusts the frequency by outputting a set of frequency increasing signal and frequency reducing signal, in which the frequency detector 532 outputs a logic high frequency increasing signal and a logic low frequency reducing signal to increase the frequency when the clock frequency of the PLL clock signal is smaller than the base frequency of the clock signal of the input data stream, and outputs a logic low frequency increasing signal and a logic high frequency reducing signal to reduce the frequency when the clock frequency of the PLL clock signal is larger than the base frequency of the clock signal of the input data stream. However, the present invention is not limited to aforesaid two embodiments.

The frequency adjusting signal is outputted to the frequency lock controller 534. The frequency lock controller 534 not only receives the frequency adjusting signal, but also receives the PLL clock signal generated by the PLL unit 530, and generates the voltage adjusting signal according to the frequency adjusting signal and the PLL clock signal (step S608).

In detail, the frequency lock controller 534, for example, increases a value of the voltage adjusting signal when receiving the logic high signal outputted by the frequency detector 532, so as to control the voltage controlled oscillator 510 to increase the clock frequency of the reference clock signal; and reduces the value of the voltage adjusting signal when receiving the logic low signal outputted by the frequency detector 532, so as to control the voltage controlled oscillator 510 to reduce the clock frequency of the reference clock signal.

For example, as shown in FIG. 3, the frequency lock controller 534 generates a N-bit voltage adjusting signal FREQ_D and increases or reduces a value of the voltage adjusting signal FREQ_D according to the frequency adjusting signal outputted by the frequency detector 532.

This N-bit voltage adjusting signal FREQ_D is then transmitted to the digital-to-analog converter 540, and converted into a voltage variation VA by the digital-to-analog converter 540 (step S610). The voltage variation VA is used for adjusting the clock frequency of the reference clock signal generated by the voltage controlled oscillator 510.

In detail, the voltage controlled oscillator 510 increases or reduces the clock frequency of the generated reference clock signal by a frequency level according to the voltage variation VA outputted by the digital-to-analog converter 540, and outputs the adjusted reference clock signal (step S612). The frequency level is, for example, a product of a frequency gain Kf and the voltage variation VA of the voltage controlled oscillator 510, and the adjusted clock frequency (ref_t_n) of the reference clock signal is the clock frequency (ref_t_n−1) plus a product of the frequency gain Kf and the voltage variation VA, that is, f(ref_t_n)=f(ref_t_n−1)+Kf*VA.

The adjusted reference clock signal is inputted into the PLL unit 520. The PLL unit 520 increases the clock frequency of the adjusted reference clock signal to generate the PLL clock signal (step S604). Through repeatedly executing aforesaid steps of the PLL unit 520 generating the PLL clock signal, the data receiver 530 comparing the clock signal, the digital-to-analog converter 510 converting the voltage adjusting signal and the voltage controlled oscillator 510 adjusting the clock frequency, the clock frequency of the PLL clock signal finally generated by the PLL unit 520 can be locked to the base frequency of the clock signal of the input data stream, such that the PLL clock signal is able to serve as a clock signal source with accurate frequency and is provided for the data transmitter 550 to transmit data stream.

In detail, the data transmitter 550 is coupled to the PLL unit 520 and used for receiving the output data stream and the PLL clock signal generated by the PLL unit 520, and transmitting the data stream according to the PLL clock signal.

Through aforesaid feedback mechanism, the PLL unit 520 of the present embodiment is able to lock the clock frequency of the PLL clock signal generated thereby to the base frequency of the clock signal of the input data stream or a predetermined multiple of the base frequency, such that the frequency error of the PLL clock signal can be reduced (e.g. 100 ppm), and the voltage controlled oscillator 510 can replace the conventional crystal device and serve as a reference signal source inside the integrated chip.

Third Embodiment

On the other hand, the present invention also uses tokens of the SOF defined in the specification of universal serial bus (USB) 2.0 to compare the PLL clock signal with the clock signal of the input data stream, so as to adjust the clock frequency of the reference clock signal generated by the voltage controlled oscillator.

Figure 7:
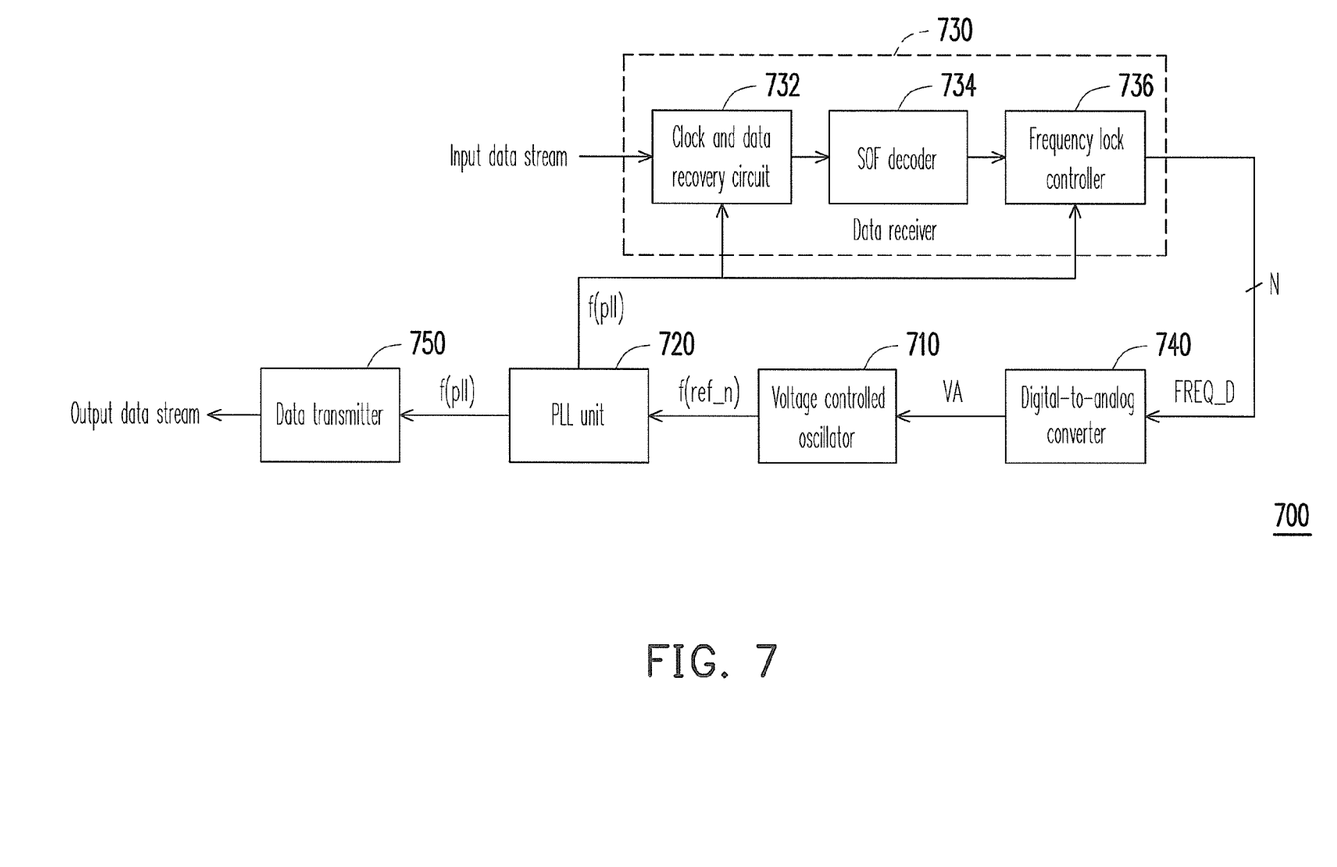
FIG. 7 is a block diagram of a data transceiving system for generating a reference clock signal according to third embodiment of the present invention.
Figure 8:
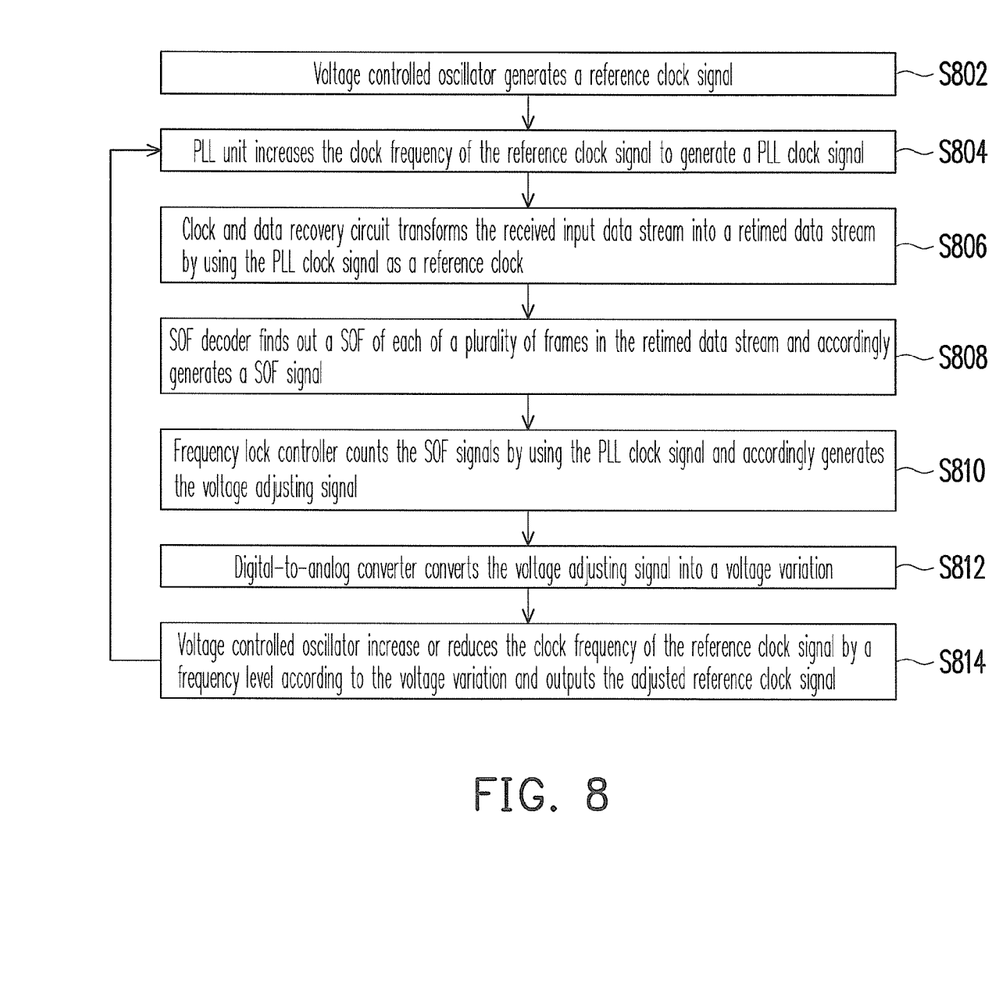
FIG. 8 is flowchart illustrating a method for generating a reference clock signal according to third embodiment of the present invention.

FIG. 7 is a block diagram of a data transceiving system for generating a reference clock signal according to third embodiment of the present invention. FIG. 8 is flowchart illustrating a method for generating a reference clock signal according to third embodiment of the present invention. Referring to both FIG. 7 and FIG. 8, the data transceiving system 700 of the present embodiment comprises a voltage controlled oscillator 710, a PLL unit 720, a data receiver 730, a digital-to-analog converter 740, and a data transmitter 750, in which the data receiver 730 further comprises a clock and data recovery circuit 732, a SOF decoder 734, and a frequency lock controller 736. The functions of aforesaid components are respectively described in the following.

First, the voltage controlled oscillator 710 generates a reference clock signal (ref_tn) (step S802). The PLL unit 720 is coupled to the voltage controlled oscillator 710 and used for increasing the clock frequency of the reference clock signal outputted by the voltage controlled oscillator 710 (step S804). The functions of the voltage controlled oscillator 710 and the PLL unit 720 are similar to those of voltage controlled oscillator 510 and the PLL unit 520 in the second embodiment, so the detail is omitted herein.

The difference from the second embodiment is on that the data transceiving system 700 of the present embodiment uses the clock and data recovery circuit 732 to receive the input data stream sent externally and the PLL clock signal generated by the PLL unit 720, and uses the PLL clock signal as a reference clock to transform the received input data stream into a retimed data stream (step S806). In the present embodiment, the clock and data recovery circuit 732 may be an oversampling data recovery circuit, while in another embodiment, the clock and data recovery circuit 732 may also be a burst-mode clock and data recovery circuit or other types of circuits for recovering the data and clock of the received data stream.

Next, the SOF decoder 734 finds out a SOF of each of a plurality of frames in the retimed data stream, so as to generate a SOF signal (step S808). In detail, an external USB device or USB hub adds a SOF token in a data header of each frame when generating or transmitting data stream in a high-speed mode, and provides the same for the data receiver to determine the SOF of each frame.

Figure 9:
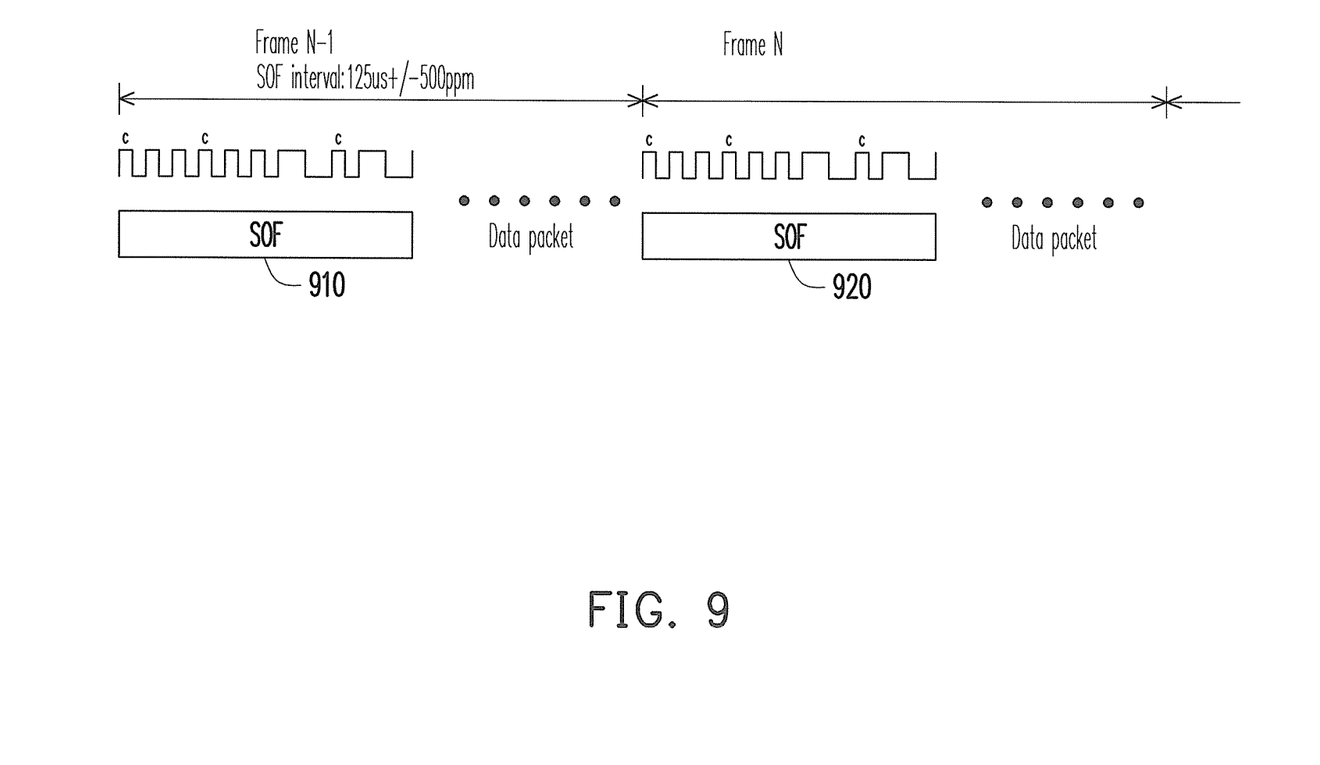
FIG. 9 is waveform graph of a SOF token according to third embodiment of the present invention.

For example, FIG. 9 is waveform graph of a SOF token according to third embodiment of the present invention. FIG. 9 illustrates a frame N and a frame N−1 of the input data stream 900. In the header of the data packages of these two frames are respectively inserted with the SOF tokens 910 and 920, so as to enable the data receiver to read the frame N and the frame N−1. In the present embodiment, an interval between the SOF tokens 510 and 520 is 125 micro-seconds and an error range is 500 ppm according to the specification of USB 2.0, however, the interval may also be 225 micro-seconds or can be defined according to different specifications, which is not limited herein.

In the present embodiment, the frequency lock controller 736 receives the SOF signal generated by the SOF decoder 734 and the PLL clock signal generated by the PLL unit 720, counts the SOF signals by using the PLL clock signal, and accordingly generates the voltage adjusting signal (step S810).

In detail, the frequency lock controller 736, for example, compares the count of the frame origin signals with a standard value and increases a value of the voltage adjusting signal when the count is smaller than the standard value, so as to control the voltage controlled oscillator 710 to increase the clock frequency of the reference clock signal. On the contrary, the frequency lock controller 736 reduces the value of the voltage adjusting signal when the count is larger than the standard value, so as to control the voltage controlled oscillator 710 to reduce the clock frequency of the reference clock signal.

For example, assuming the clock frequency of a standard PLL clock signal is 480 mega hertz (MHz) and the interval between SOF tokens is 125 micro-seconds, the count of SOF tokens within a PLL clock cycle should be 60000. However, in practice, if the clock frequency of the PLL clock signal is smaller than 480 MHz, the count of the SOF tokens within a PLL clock cycle is less than 6000, and therefore the frequency lock controller has to increase the value of the voltage adjusting signal so as to control the voltage controlled oscillator to increase the clock frequency of the reference clock signal. On the contrary, if the clock frequency of the PLL clock signal is larger than 480 MHz, the count of the SOF tokens within a PLL clock cycle is more than 6000, and therefore the frequency lock controller has to reduce the value of the voltage adjusting signal so as to control the voltage controlled oscillator to reduce the clock frequency of the reference clock signal. Through aforesaid adjustment, finally the clock frequency of the PLL clock signal approaches 480 MHz under a standard status.

Further, as described in the second embodiment, the frequency lock controller 736 generates a N-bit voltage adjusting signal FREQ_D and increases or reduces a value of the voltage adjusting signal FREQ_D according to the frequency adjusting signal outputted by the frequency detector 732. Next, the digital-to-analog converter 740 converts the voltage adjusting signal FREQ_D into a voltage variation VA (step S812), and uses the same to control the voltage controlled oscillator 710 to adjust the clock frequency of the reference clock signal generated thereby (step S814). Detailed adjusting methods are described in the second embodiment, which is not repeated herein.

The adjusted reference clock signal is inputted into the PLL unit 720. The PLL unit 720 increases the clock frequency of the adjusted reference clock signal to generate the PLL clock signal (step S804). Through repeatedly executing aforesaid steps of the PLL unit 720 generating the PLL clock signal, the data receiver 730 comparing the clock signal, the digital-to-analog converter 740 converting the voltage adjusting signal and the voltage controlled oscillator 710 adjusting the clock frequency, finally the clock frequency of the PLL clock signal generated by the PLL unit 720 can be locked to the base frequency of the clock signal of the input data stream, such that the PLL clock signal is able to serve as a clock signal source with accurate frequency and provided for the data transmitter 750 to transmit data stream.

It is noted herein that the structures of the second and third embodiments can be integrated in the same data transceiving system and a detection of SOF can be used to determine the methods of adjustment. When the SOF is detected, a path of the clock and data recovery circuit is adopted, and a number of the SOF of a plurality of frames in the data stream in a unit time is counted and used to determine whether to increase or reduce the clock frequency of the reference clock signal generated by the voltage controlled oscillator. On the contrary, a path of the frequency detector is adopted, and the clock frequency of the PLL clock signal is directly compared with the base frequency of the clock signal of the input data stream, so as to determine whether to increase or reduce the clock frequency of the reference clock signal generated by the voltage controlled oscillator.

To sum up, the method and the data transceiving system for generating the reference clock signal of the present invention compare the PLL clock signal generated by the PLL unit with the clock signal of the input data stream so as to determine whether the PLL clock signal is accurate, and returns the comparison result to the voltage controlled oscillator through a feedback mechanism, so as to adjust the clock frequency of the reference clock signal generated thereby. Through multiple comparison, feedback and adjustment steps, finally the clock frequency of the PLL clock signal is locked to the base frequency of the clock signal of the input data stream, such that the frequency error of the PLL clock signal is able to comply with the standard specification. Accordingly, the present invention uses a voltage controlled oscillator disposed inside an integrated chip to replace a conventional crystal device, thus reducing the manufacture cost of the integrated chip.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A data transceiving system for generating a reference clock signal, comprising:
    a voltage controlled oscillator, for generating the reference clock signal;
    a phase lock loop (PLL) unit, coupled to the voltage controlled oscillator, for increasing a clock frequency of the reference clock signal to generate a PLL clock signal; and
    a data receiver, coupled to the PLL unit and the voltage controlled oscillator, for receiving an input data stream and the PLL clock signal so as to output a voltage adjusting signal to the voltage controlled oscillator, wherein the data receiver comprises:
        a frequency detector, for receiving the input data stream and comparing a clock frequency of the PLL clock signal with a base frequency of the clock signal of the input data stream, so as to generate a frequency adjusting signal;
        a clock and data recovery circuit, for receiving the input data stream and the PLL clock signal, and transforming the input data stream into a retimed data stream by using the PLL clock signal as a reference clock;
        a SOF decoder, for finding a start-of-frame (SOF) of each of a plurality of frames in the retimed data stream, so as to generate SOF signals; and
        a frequency lock controller, for receiving the frequency adjusting signal and the PLL clock signal and accordingly generating the voltage adjusting signal, or receiving the SOF signals generated by the SOF decoder and the PLL clock signal, counting the SOF signals by using the PLL clock signal, and accordingly generating the voltage adjusting signal,
    wherein the voltage controlled oscillator adjusts the clock frequency of the reference clock signal according to the voltage adjusting signal, so as to lock the clock frequency of the PLL clock signal generated by the PLL unit to the base frequency of the clock signal of the input data stream,
    wherein when the SOF is not detected, the frequency lock controller receives the frequency adjusting signal and the clock signal and accordingly generates the voltage adjusting signal, so as to determine whether to increase or reduce the clock frequency of the reference clock signal, and when the SOF is detected by the SOF decoder, the frequency lock controller counts a number of the SOF of the plurality of frames in the retimed data stream, which is transformed from the input data stream, to determine whether to increase or reduce the clock frequency of the reference clock signal.

2. The data transceiving system as claimed in claim 1, wherein the frequency detector comprises:
    outputting a logic high signal when the base frequency of the clock signal of the input data stream is larger than the clock frequency of the PLL clock signal; and
    outputting a logic low signal when the base frequency of the clock signal of the input data stream is smaller than the clock frequency of the PLL clock signal.

3. The data transceiving system as claimed in claim 2, wherein the frequency lock controller increases a value of the voltage adjusting signal when receiving the logic high signal, so as to control the voltage controlled oscillator to increase the clock frequency of the reference clock signal, and reduces a value of the voltage adjusting signal when receiving the logic low signal, so as to control the voltage controlled oscillator to reduce the clock frequency of the reference clock signal.

4. The data transceiving system as claimed in claim 1, wherein the frequency lock controller executes a plurality of steps, and the steps comprises:
    comparing a count of the SOF signals with a standard value;
    increasing a value of the voltage adjusting signal when the count is smaller than the standard value, so as to control the voltage controlled oscillator to increase the clock frequency of the reference clock signal; and
    reducing a value of the voltage adjusting signal when the count is larger than the standard value, so as to control the voltage controlled oscillator to reduce the clock frequency of the reference clock signal.

5. The data transceiving system as claimed in claim 1, wherein the voltage controlled oscillator increases or reduces the clock frequency of the reference clock signal by a frequency level according to the voltage adjusting signal.

6. The data transceiving system as claimed in claim 5, wherein the frequency level is a product of a frequency gain and a voltage variation of the voltage controlled oscillator.

7. The data transceiving system as claimed in claim 6, further comprising:
a digital-to-analog converter, disposed between the voltage controlled oscillator and the data receiver, for transforming the voltage adjusting signal outputted by the data receiver into the voltage variation, so as to adjust the clock frequency of the reference clock signal generated by the voltage controlled oscillator.

8. The data transceiving system as claimed in claim 1, further comprising:
a data transmitter, coupled to the PLL unit, for receiving an output data stream and the PLL clock signal, and transmitting the output data stream according to the PLL clock signal.

9. A method for generating a reference clock signal, comprising:
generating the reference clock signal by using a voltage controlled oscillator;
increasing a clock frequency of the reference clock signal to generate a PLL clock signal;
comparing the PLL clock signal with a clock signal of an input data stream, and accordingly outputting a voltage adjusting signal; and
adjusting the clock frequency of the reference clock signal generated by the voltage controlled oscillator according to the voltage adjusting signal, so as to lock the clock frequency of the generated PLL clock signal to a base frequency of the clock signal of the input data stream, wherein the step of comparing the PLL clock signal with the clock signal of the input data stream and accordingly outputting the voltage adjusting signal comprises:
receiving the input data stream and comparing the clock frequency of the PLL clock signal with the base frequency of the clock signal of the input data stream, so as to generate a frequency adjusting signal;
receiving the input data stream and the PLL clock signal, and transforming the input data stream into a retimed data stream by using the PLL clock signal as a reference clock;
finding a start-of-frame (SOF) of each of a plurality of frames in the retimed data stream, so as to generate SOF signals; and
receiving the frequency adjusting signal and the PLL clock signal and accordingly generating the voltage adjusting signal, or receiving the SOF signals and the PLL clock signal, counting the SOF signals by using the PLL clock signal, and accordingly generating the voltage adjusting signal,
wherein when the SOF is not detected, the frequency adjusting signal and the PLL clock signal are received to generate the voltage adjusting signal, so as to determine whether to increase or reduce the clock frequency of the reference clock signal, and when the SOF is detected, a number of the SOF of the plurality of frames in the retimed data stream, which is transformed from the input data stream, is counted to determine whether to increase or reduce the clock frequency of the reference clock signal.

10. The method as claimed in claim 9, wherein the step of comparing the clock frequency of the PLL clock signal with the base frequency of the clock signal of the input data stream, so as to generate the voltage adjusting signal comprises:
outputting a logic high signal when the base frequency of the clock signal of the input data stream is larger than the clock frequency of the PLL clock signal; and
outputting a logic low signal when the base frequency of the clock signal of the input data stream is smaller than the clock frequency of the PLL clock signal.

11. The method as claimed in claim 10, wherein the step of receiving the frequency adjusting signal and the PLL clock signal and accordingly generating the voltage adjusting signal comprises:
increasing a value of the voltage adjusting signal when receiving the logic high signal, so as to control the voltage controlled oscillator to increase the clock frequency of the reference clock signal; and
reducing a value of the voltage adjusting signal when receiving the logic low signal, so as to control the voltage controlled oscillator to reduce the clock frequency of the reference clock signal.

12. The method as claimed in claim 9, wherein the step of counting the SOF signals by using the PLL clock signal, and accordingly generating the voltage adjusting signal comprises:
comparing a count of the SOF signals with a standard value;
increasing a value of the voltage adjusting signal when the count is smaller than the standard value, so as to control the voltage controlled oscillator to increase the clock frequency of the reference clock signal; and
reducing a value of the voltage adjusting signal when the count is larger than the standard value, so as to control the voltage controlled oscillator to reduce the clock frequency of the reference clock signal.

13. The method as claimed in claim 9, wherein the step of adjusting the clock frequency of the reference clock signal generated by the voltage controlled oscillator according to the voltage adjusting signal comprises:
increasing or reducing the clock frequency of the reference clock signal generated by the voltage controlled oscillator by a frequency level according to the voltage adjusting signal.

14. The method as claimed in claim 13, wherein the frequency level is a product of a frequency gain and a voltage variation of the voltage controlled oscillator.

15. The method as claimed in claim 14, wherein after the step of comparing the PLL clock signal with the clock signal of the input data stream, and accordingly outputting a voltage adjusting signal, the method further comprising:
transforming the voltage adjusting signal into the voltage variation, so as to adjust the clock frequency of the reference clock signal generated by the voltage controlled oscillator.

16. The method as claimed in claim 14, wherein after the step of adjusting the clock frequency of the reference clock signal generated by the voltage controlled oscillator according to the voltage adjusting signal, so as to lock the clock frequency of the generated PLL clock signal to a base frequency of the clock signal of the input data stream, the method further comprising:
transmitting an output data stream according to the PLL clock signal.

* * * * *